United States Patent [19]
Abdi

[11] Patent Number: 5,214,319
[45] Date of Patent: May 25, 1993

[54] MONOTONIC PULSE DETECTOR

[75] Inventor: Behrooz L. Abdi, Chandler, Ariz.

[73] Assignee: Motorola, Inc., Schaumburg, Ill.

[21] Appl. No.: 944,012

[22] Filed: Sep. 11, 1992

Related U.S. Application Data

[63] Continuation of Ser. No. 706,472, May 28, 1991, abandoned.

[51] Int. Cl.[5] .................. H03K 5/153; H03K 5/22
[52] U.S. Cl. ..................... 307/351; 307/354; 307/360; 307/362; 328/115; 328/116; 328/117; 324/102; 324/103 P; 324/111
[58] Field of Search ............... 307/351, 354, 360, 362, 307/443; 328/115–117, 164; 324/102, 103 P, 111

[56] References Cited

U.S. PATENT DOCUMENTS 3,896,375 7/1975 Trolliet ........................ 324/103 P
4,737,730 4/1988 Ishiwata et al. ................. 328/117
4,896,104 1/1990 Patel et al. .................... 307/351

FOREIGN PATENT DOCUMENTS 0216269 10/1985 Japan .................. 324/103 P

OTHER PUBLICATIONS

"Auto peak detector for use with pen plotters" Hynds, Electronic Product Design, Mar. 1982, p. 26, 307–351.

Primary Examiner—William L. Sikes
Assistant Examiner—M. Wambach
Attorney, Agent, or Firm—Robert D. Akings

[57] ABSTRACT

A pulse detector keeps track of the peak value of an analog input signal and clocks output data pulses into a flipflop and shift register at peak values thereof while it monotonically increases in magnitude for each polarity. The data input to the flipflop becomes logic zero once the analog input signal changes direction toward the opposite polarity, whereby the last output data pulse in the shift register corresponds to the maximum peak of the analog input signal during the given polarity.

11 Claims, 2 Drawing Sheets

MONOTONIC PULSE DETECTOR

This application is a continuation of prior application Ser. No. 07/706,472 filed May 28, 1991 now abandoned.

FIELD OF THE INVENTION

This invention relates in general to pulse detector circuits and, more particularly, to a pulse detector responsive to a monotonically increasing input signal.

BACKGROUND OF THE INVENTION

A pulse detector is a common electronic component used, for example, in computer disk drives to convert an analog signal from the read/write heads into digital logic levels for use by the computer system. In the disk drive example, the analog waveform is generated as the read/write head moves on the disk tracks reading the magnetic information stored thereon.

Most, if not all, known pulse detectors generate digital output pulses when the analog signal reach a peak value above a predetermined threshold. An ideal analog read-back signal from the disk head has single, distinctive positive and negative peaks flowing in a smooth waveform, whereby the pulse detector may sample the peak level of the analog signal at one point to obtain the corresponding logic level. However, in practice the analog waveform may include multiple peaks caused by magnetic pickup from adjacent disk tracks as the read/write head traverses the track of interest. The adjacent track interference causes multiple peaking in the analog waveform and generates multiple output pulses from the pulse detector. Generally, it is difficult to determine which output pulse corresponds to the true peak of the analog waveform for providing maximum signal-to-noise ratio.

Hence, what is needed is an improved pulse detector which detects monotonically increasing peaks and ignores peaks following the maximum amplitude of the analog signal.

SUMMARY OF THE INVENTION

Briefly stated, the invention comprises a circuit for generating an output pulse corresponding to a peak value of an analog input signal including a first circuit for detecting monotonic increases in the magnitude of the analog input signal and providing an output signal having a first logic state in response thereto, and a second circuit coupled for receiving the analog input signal and issuing a clock signal at peaks thereof, while a third circuit stores the output signal of the first circuit having the first logic state as the output pulse of the circuit upon receiving the clock signal of the second circuit.

In another aspect, the present invention is a method of generating an output pulse corresponding to a peak value of an analog input signal comprising the steps of detecting monotonic increases in the magnitude of the analog input signal and providing an output signal having a first logic state in response thereto, developing a clock signal at peaks of the analog input signal, and storing the output signal having the first logic state as the output pulse of the circuit upon receiving the clock signal such that the most recent output pulse of the circuit when the analog input signal changes direction toward the opposite polarity corresponds to the maximum value of the analog input signal.

Thus, one advantage of the present invention is the technique of tracking the peak value of an analog input signal and clocking output data pulses into a flipflop at peak values thereof while it monotonically increases in magnitude. The data input to the flipflop becomes logic zero once the analog input signal changes direction heading for the opposite polarity, whereby the last output data pulse corresponds to the maximum peak of the analog input signal.

DETAILED DESCRIPTION OF THE PREFERRED EMBODIMENT

Figure 1:
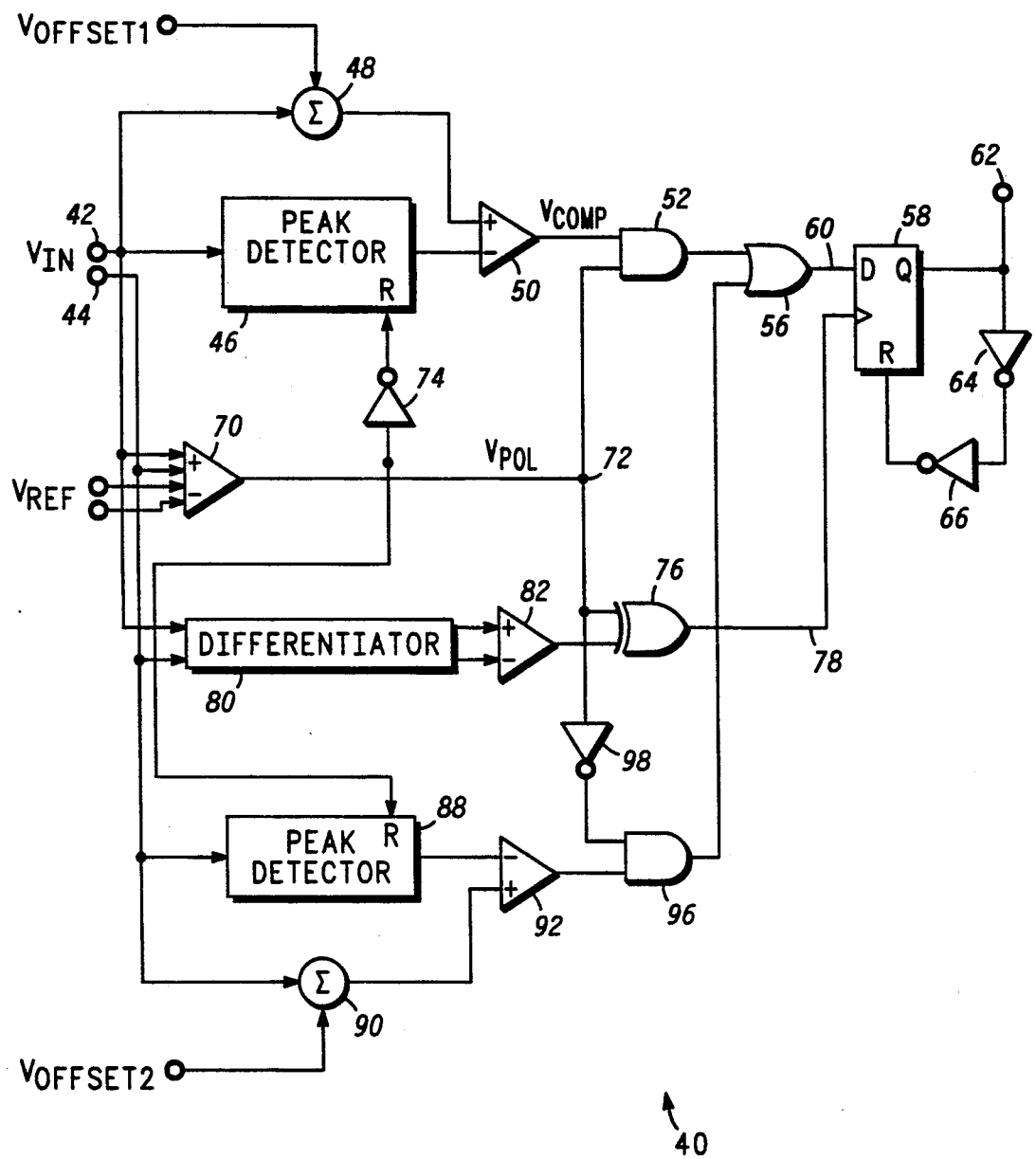
FIG. 1 is a pulse detector in accordance with the present invention.

Referring to FIG. 1, there is shown pulse detector 40 in accordance with the present invention suitable for manufacturing as an integrated circuit using conventional integrated circuit processes. A differential analog input signal $V_{IN}$ is applied across inputs 42 and 44 of pulse detector 40 such that a first single-ended signal from input 42 is applied to peak detector 46 and at the first input of summing junction 48, while the second input of summing junction 48 receives a DC offset signal $V_{OFFSET1}$, say 20 millivolts. The output of peak detector 46 and the output of summing junction 48 are coupled to the inverting and non-inverting inputs of comparator 50, respectively. The output signal of comparator 50, $V_{COMP}$, is applied at the first input of AND gate 52, and the output of AND gate 52 is coupled to the first input of OR gate 56. The output of OR gate 56 is applied at the data input of flipflop 58 at node 60, while the Q-output of flipflop 58 provides the output data pulse at output 62 which is applied back through inverters 64 and 66 to the reset input of the same. An external shift register (not shown) may be coupled to output 62 for storing the output data pulses from flipflop 58 during each state of the $V_{POL}$ polarity signal. Components 46–52 process the positive polarity of the input signal $V_{IN}$.

The differential input signal $V_{IN}$ is also applied at the non-inverting input of comparator 70 while its inverting input receives a differential reference threshold $V_{REF}$ which is typically 30% of the maximum peak of the input signal $V_{IN}$. Comparator 70 has a hysteresis property such that once tripped, the differential input signal $V_{IN}$ must fall a predetermined offset below $V_{REF}$ to reset the output. The output polarity signal of comparator 70, $V_{POL}$, at node 72 is complemented by inverter 74 and applied at the reset input of peak detector 46 for setting its peak value to a predetermined low level in preparation for the next cycle. The $V_{POL}$ signal is also applied at the second input of AND gate 52 and to the first input of exclusive-OR gate 76, while the output of exclusive-OR gate 76 is coupled to the clock input of flipflop 58 at node 78. Differentiator 80 has differential inputs coupled for receiving the differential input signal $V_{IN}$ and differential outputs coupled to the non-inverting and inverting inputs of comparator 82. The output of comparator 82 is coupled to the second input of exclusive-OR gate 76. The combination of comparator 82 and exclusive-OR gate 76 operates as a zero-crossing detector for the differential analog input signal.

A second single-ended signal from the differential input signal $V_{IN}$ at input 44 for the negative polarity is applied to peak detector 88 and at the first input of summing junction 90, while the second input of summing junction 90 receives a DC offset signal $V_{OFFSET2}$, say 20 millivolts. The reset input of peak detector 88 is coupled for receiving the $V_{POL}$ output signal of comparator 70 for setting its peak value to a predetermined low level in preparation for the next cycle. Peak detectors 46 and 88 are devices that provide an output signal $V_{PEAK}$ equal to the maximum value of the input signal $V_{IN}$ during the operation cycle as defined between reset pulses from the $V_{POL}$ signal. The output of peak detector 88 and the output of summing junction 90 are coupled to the inverting and non-inverting inputs of comparator 92, respectively, while the output signal of comparator 92 is applied at the first input of AND gate 96. The second input of AND gate 96 receives the $V_{POL}$ complemented by inverter 98, and the output of AND gate 96 is coupled to the second input of OR gate 56. Components 88-98 process the negative polarity of the input signal $V_{IN}$.

Figure 2A:
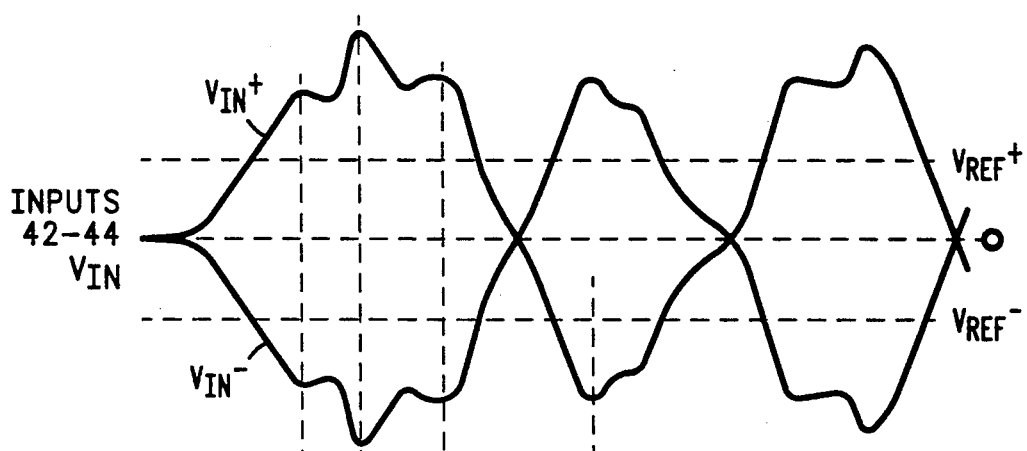
FIGS. 2A-2E are waveform plots useful in the explanation of the pulse detector of FIG. 3.
Figure 2B:
Figure 2C:
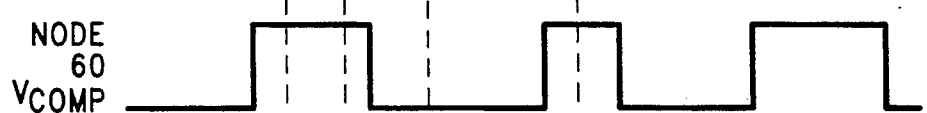

Turning to FIG. 2A, the input waveform $V_{IN}$ is shown with multiple peaks possibly caused by interference from adjacent tracks on the magnetic disk drive. The DC offset signal $V_{OFFSET1}$ is added to the first single-ended signal from input 42 and the result applied at the non-inverting input of comparator 50. Once the differential input signal $V_{IN}$ exceeds the differential threshold $V_{REF}$, the $V_{POL}$ signal becomes logic one, releasing the reset on peak detector 46 and allowing it to track the peak value of the first single-ended signal as shown in FIG. 2B. With the DC offset signal $V_{OFFSET1}$, the $V_{COMP}$ signal from comparator 50 is high as long as the first single-ended signal monotonically increases, see FIG. 2C.

An equivalent technique is to route the first single-ended signal from input 42 directly to the non-inverting input of comparator 50 and subtract the DC offset $V_{OFFSET1}$ from the output signal of peak detector 46 before application to the inverting input of comparator 50. The end result is the same, in that the $V_{PEAK}$ output signal of peak detector 46 follows the first single-ended signal less the DC offset.

Figure 2D:
Figure 2E:
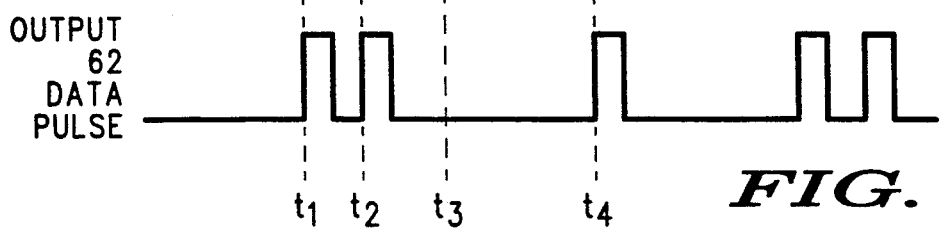

At time $t_1$ of FIGS. 2A-2E, the $V_{COMP}$ is logic one and the $V_{POL}$ signal is logic one producing a logic one at the data input of flipflop 58. The rising waveform (positive slope) of FIG. 2A prior to time $t_1$ translates to a positive signal from differentiator 80 at the non-inverting input of comparator 82 and logic ones at the first and second inputs of exclusive-OR gate 76. The peak at time $t_1$ differentiates to a logic zero at the non-inverting input of comparator 82 which causes the output signal of comparator 82 to become logic zero, producing a logic one pulse at node 78 to clock in the logic one at the data input of flipflop 58, as per FIG. 2D. The Q-output of flipflop 58 switches to logic one for the time delay of inverters 64-66 before being reset as shown in FIG. 2E. The output data pulse at time $t_1$ is also stored in the external shift register.

The first single-ended signal continues to rise with a positive slope until reaching another peak at time $t_2$, this time the maximum peak, causing the output signal of comparator 82 to become logic zero again and producing another logic one pulse at node 78 to clock in the logic one at the data input of flipflop 58. The Q-output of flipflop 58 again switches to logic one for the time delay of inverters 64-66 before resetting, thereby storing another output data pulse in the external shift register.

The differential input signal $V_{IN}$ begins to fall toward a negative polarity after time $t_2$, although peak detector 46 maintains the peak value at the inverting input of comparator 50. Once the output signal of summing junction 48 is less than the peak value of the first single-ended signal, the $V_{COMP}$ signal from comparator 50 drops to logic zero, forcing the output of AND gate 52 and node 60 both to logic zero. The peak at time $t_3$ differentiates to zero, producing another pulse at node 78 as shown in FIG 2D. Yet, the pulse at node 78 clocks a logic zero into flipflop 58 and the same logic zero into the external shift register. Therefore, since the first single-ended signal is moving toward a negative polarity, i.e., no longer monotonically increasing during the positive polarity of the input signal $V_{IN}$, no further logic ones are Clocked into flipflop 58. The last logic one in the external shift register during the high state of the $V_{POL}$ signal corresponds to the maximum peak of the input signal $V_{IN}$ at time $t_2$, and a maximum SNR for the output data pulse.

Circuit components 88-96 are a mirror image of circuit components 46-52 for processing the second single-ended signal from input 44. The DC offset signal $V_{OFFSET2}$ is added to the second single-ended signal from input 44 and the result applied at the non-inverting input of comparator 92. The output signal of comparator 92 is thus high as long as the second single-ended signal monotonically increases in magnitude. The $V_{POL}$ signal becomes logic zero after the differential input signal $V_{IN}$ becomes less than the differential reference signal $V_{REF}$, releasing the reset on peak detector 88 and allowing it to track the peak value of the second single-ended signal. The change of state of the $V_{POL}$ signal also resets the external shift register in preparation for the negative cycle of the input signal $V_{IN}$.

At time $t_4$, the output of comparator 92 is logic one and the output signal of inverter 98 is logic one, producing a logic one at the second input of OR gate 56 and a logic one at the data input of flipflop 58. The decreasing slope of FIG 2A prior to time $t_4$ translates to a negative signal from differentiator 80 at the non-inverting input of comparator 82 and logic zeroes at the first and second inputs of exclusive-OR gate 76. The peak at time $t_4$ differentiates to a logic zero at the non-inverting input of comparator 82, causing the output signal thereof to become logic one and producing a logic one pulse at node 78 to clock in the logic one at the data input of flipflop 58. Again, the Q-output of flipflop 58 switches to logic one for the time delay of inverters 64-66 before resetting. The output data pulse is also stored in the external shift register.

The differential input signal $V_{IN}$ turns positive again although peak detector 88 maintains the peak value at the inverting input of comparator 92. Once the output signal of summing junction 90 is less than the peak value of the second single-ended signal, the output of comparator 92 drops to logic zero, thereby forcing the output of AND gate 96 and node 60 both to logic zero. Any subsequent peak of the input signal $V_{IN}$ during the low state of the $V_{POL}$ signal clocks a logic zero into flipflop 58. Again, the last logic one in the external shift register during the low state of the $V_{POL}$ signal corresponds to the maximum negative peak of the input signal $V_{IN}$.

Hence, what has been provided is a novel pulse detector which keeps track of the peak value of an analog input signal and clocks output data pulses into a flipflop and shift register at peak values thereof while monotonically increasing in magnitude. The data input to the flipflop becomes logic zero once the analog input signal changes direction, whereby the last output data pulse in the shift register corresponds to the maximum peak of the analog input signal.

I claim:

1. A peak detector circuit for generating output pulses corresponding to monotonically increasing amplitude peaks of a differential input signal, comprising:

first means for detecting monotonic increases in amplitude of the differential input signal and providing a digital output signal having a first logic state while the differential input signal monotonically increases, said first means including a first peak detector having a signal input, a reset input and an output, said signal input being coupled for receiving a first component of the differential input signal, said output maintaining an output signal at a maximum amplitude of said first component of the differential input signal, said reset input being coupled for receiving a reset signal for initializing said output signal of said first peak detector to a predetermined low amplitude;

second means coupled for receiving the differential input signal and generating clock signals at amplitude peaks of the differential input signal;

third means for storing said digital output signal having said first logic state upon receiving said clock signals and resetting said third means after a predetermined time delay for developing the output pulses of the peak detector circuit, wherein a maximum peak of the monotonically increasing amplitude peaks of the differential input signal is identified by a most recent one of the output pulses of the peak detector circuit before said digital output signal changes to a second logic state which occurs as the differential input signal changes direction toward an opposite polarity; and fourth means for detecting a polarity of the differential input signal and generating an output polarity signal having a first logic state when the differential input signal is greater than a differential reference signal and a second logic state when the differential input signal is less than said differential reference signal, said output polarity signal providing said reset signal applied at said reset input of said first peak detector, said fourth means including, (a) a first comparator having first and second inputs and an output, said first input being coupled for receiving the differential input signal, said second input being coupled for receiving said differential reference signal, said output providing said output polarity signal of said fourth means, and (b) a first inverter having an input coupled to said output of said first comparator and having an output coupled to said reset input of said first peak detector.

2. A method of generating output pulses for a circuit corresponding to monotonically increasing amplitude peaks of a differential input signal, comprising the steps of:

detecting monotonic increases in amplitude of the differential input signal and providing a first digital output signal having a first logic state while the differential input signal monotonically increases above a first predetermined threshold;

developing clock signals at amplitude peaks of the differential input signal; and storing said first digital output signal having said first logic state upon receiving said clock signals such that a maximum peak of the monotonically increasing amplitude peaks of the differential input signal is identified by a most recent one of the output pulses of the circuit before said first digital output signal changes to a second logic state which occurs as the differential input signal goes below a second predetermined threshold.

3. A circuit for generating output pulses corresponding to monotonically increasing amplitude peaks of a differential input signal, comprising:

first means for detecting monotonic increases in amplitude of the differential input signal and providing a digital output signal having a first logic state while the differential input signal monotonically increases above a first predetermined threshold;

second means coupled for receiving the differential input signal and generating clock signals at amplitude peaks of the differential input signal; and third means for storing said digital output signal having said first logic state upon receiving said clock signals and resetting said third means after a predetermined time delay for developing the output pulses of the circuit, wherein a maximum peak of the monotonically increasing amplitude peaks of the differential input signal is identified by a most recent one of the output pulses of the circuit before said digital output signal changes to a second logic state which occurs as the differential input signal goes below a second predetermined threshold.

4. The circuit of claim 3 wherein said first means includes a first peak detector having a signal input, a reset input and an output, said signal input being coupled for receiving a first component of the differential input signal, said output maintaining an output signal equal to a maximum amplitude of said first component of the differential input signal, said reset input being coupled for receiving a reset signal for initializing said output signal of said first peak detector to a predetermined low amplitude.

5. The circuit of claim 4 further including fourth means for detecting a polarity of the differential input signal and generating an output polarity signal having a first logic state when the differential input signal is greater than a differential reference signal and a second logic state when the differential input signal is less than said differential reference signal, said output polarity signal providing said reset signal to said reset input of said first peak detector.

6. The circuit of claim 5 wherein said fourth means includes:

a first comparator having first and second inputs and an output, said first input being coupled for receiving the differential input signal, said second input being coupled for receiving said differential reference signal, said output providing said output polarity signal; and a first inverter having an input coupled to said output of said first comparator and having an output coupled to said reset input of said first peak detector.

7. The circuit of claim 6 wherein said first means further includes:

a first summing circuit having first and second inputs and an output, said first input being coupled for receiving said first component of the differential input signal, said second input being coupled for receiving a first offset signal;

a second comparator having first and second inputs and an output, said first input being coupled to said output of said first peak detector, said second input being coupled to said output of said first summing circuit; and a first AND gate having first and second inputs and an output, said first input being coupled to said output of said first comparator, said second input being coupled to said output of said second comparator, said output providing said digital output signal of said first means.

8. The circuit of claim 7 wherein said second means includes:
- a differentiator circuit having an input coupled for receiving the differential input signal and having an output for providing a differentiated signal; and
- a zero-crossing detector having first and second inputs coupled for receiving said differentiated signal and having an output for providing said clock signals of said second means.

9. The circuit of claim 8 wherein said zero-crossing detector includes:
- a third comparator having first and second inputs coupled for receiving said differentiated signal from said differentiator circuit and having an output; and
- an exclusive-OR gate having first and second inputs and an output, said first input being coupled to said output of said first comparator, said second input being coupled to said output of said third comparator, said output providing said clock signals of said second means.

10. The circuit of claim 9 wherein said third means includes:
- an OR gate having first and second inputs and an output, said first input being coupled to said output of said first AND gate;
- a flipflop circuit having a data input, a clock input, a reset input and an output, said data input being coupled to said output of said OR gate, said clock input being coupled to said output of said exclusive-OR gate, said output providing the output pulses of the circuit;
- a second inverter having an input coupled to said output of said flipflop circuit and having an output; and
- a third inverter having an input coupled to said output of said second inverter and having an output coupled to said reset input of said flipflop circuit.

11. The circuit of claim 10 further comprising:
- a second peak detector having a signal input, a reset input and an output, said signal input being coupled for receiving a second component of the differential input signal, said reset input being coupled to said output of said first comparator, said output maintaining an output signal at a maximum amplitude of said second component of the differential input signal;
- a second summing circuit having first and second inputs and an output, said first input being coupled for receiving said second component of the differential input signal, said second input being coupled for receiving a second offset signal;
- a fourth comparator having first and second inputs and an output, said first input being coupled to said output of said second peak detector, said second input being coupled to said output of said second summing circuit;
- a fourth inverter having an input coupled to said output of said first comparator and having an output; and
- a second AND gate having first and second inputs and an output, said first input being coupled to said output of said fourth comparator, said second input being coupled to said output of said fourth inverter, said output being coupled to said second input of said OR gate.

* * * * *